United States Patent

Huang

Patent Number: 5,929,449
Date of Patent: Jul. 27, 1999

[54] FLAT PANEL DETECTOR FOR RADIATION IMAGING WITH REDUCED ELECTRONIC NOISE

[75] Inventor: Zhong Shou Huang, Mississauga, Canada

[73] Assignee: 1294339 Ontario, Inc., Toronto, Canada

[21] Appl. No.: 09/000,481

[22] PCT Filed: Jul. 31, 1995

[86] PCT No.: PCT/CA95/00457

§ 371 Date: Jul. 20, 1998

§ 102(e) Date: Jul. 20, 1998

[87] PCT Pub. No.: WO97/05505

PCT Pub. Date: Feb. 13, 1997

[51] Int. Cl.[6] .......................... H01L 31/0224; G01T 1/24
[52] U.S. Cl. ............................. 250/370.09; 250/370.08; 250/208.1
[58] Field of Search ........................ 250/370.09, 370.08, 250/370.14, 208.1; 257/446, 448

[56] References Cited

U.S. PATENT DOCUMENTS

| | | |
|---|---|---|
| 4,382,187 | 5/1983 | Fraleux et al. . |
| 4,689,487 | 8/1987 | Nishiki et al. . |
| 5,079,426 | 1/1992 | Antonuk et al. . |
| 5,262,649 | 11/1993 | Antonuk et al. . |
| 5,319,206 | 6/1994 | Lee et al. . |
| 5,331,179 | 7/1994 | Lee et al. . |
| 5,396,072 | 3/1995 | Schiebel et al. . |
| 5,610,403 | 3/1997 | Kingsley et al. ................... 250/370.09 |
| 5,610,404 | 3/1997 | Possin ................................. 250/370.09 |

FOREIGN PATENT DOCUMENTS 0 574 690  12/1993  European Pat. Off. .
WO 94/25878  11/1994  WIPO .

OTHER PUBLICATIONS

W. Zhao et al. "Digital Chest Radiology Using Self–Scanned Readout of Amorphous Selenium", *Medical Physics*, vol. 18, No. 5, Sep./Oct. 1991, p. 1073.

T. Tsukada, et al., "New Solid–State Image Pickup Devices Using Photosenstive Chalcogenide Glass Film", Proceedings of IEEE International Electronic Devices Meeting, 1979, pp. 134–136.

*Primary Examiner*—Edward P. Westin
*Assistant Examiner*—Richard Hanig
*Attorney, Agent, or Firm*—Fay, Sharpe, Beall, Fagan, Minnich & McKee, LLP

[57] ABSTRACT

A thin-film, flat panel, pixelated detector array serving as a real-time digital imager and dosimeter for diagnostic or mega-voltage X rays or gamma rays, including a plurality of photodiodes (30) made of hydrogenated amorphous silicon arrayed in columns and rows upon a glass substrate (12). Each photodiode (30) is connected to a thin film field effect transistor (52) also located upon the glass or quartz substrate (12). Upper and lower metal contacts (38, 22) are located below and above the photodiodes (30) to provide the photodiodes (30) with a reverse bias. The capacitance of each photodiode (30) when multiplied by the resistance of the field effect transistor (52) to which it is connected yields an RC time constant sufficiently small to allow fluoroscopic or radiographic imaging in real time.

18 Claims, 7 Drawing Sheets

FLAT PANEL DETECTOR FOR RADIATION IMAGING WITH REDUCED ELECTRONIC NOISE

TECHNICAL FIELD

The present invention relates to imaging systems and in particular to a flat panel detector for radiation imaging.

BACKGROUND ART

X-ray imaging systems are widely used in medical diagnosis and industrial and security inspection environments. One well known prior art x-ray imaging system is commonly referred to as an x-ray image intensifier ("XII") system. The XII system includes a large image tube that converts a low intensity x-ray image into a visible image. Incident x-rays are transmitted through a low absorbing window, then absorbed by an input phosphor screen and converted into a light image. On the inner surface of the input phosphor screen is a photocathode which converts the light into photoelectrons. The photoelectrons are accelerated and focused by an electrical static lens. The focused photoelectrons bombard an output phosphor screen and are converted into an optical image. A charge-coupled device ("CCD") or a camera tube is coupled to the output phosphor screen to convert the light image into an electronic video signal.

However, the XII system suffers from a number of problems due to the multiple conversion stages, resulting in a reduction in image resolution and image contrast as well as pincussion distortion caused by the magnification error of the electrical static lens. Moreover, the XII system is complex and bulky.

To overcome the problems associated with the XII system, alternative x-ray imaging systems employing flat-panel radiation image sensors have been proposed. For example, U.S. Pat. No. 4,382,187 to Fraleux et al. and U.S. Pat. No. 4,689,487 to Nishiki et al. disclose early designs of large area flat-panel radiation image sensors for use in radiation imaging systems. These flat-panel sensors are responsive to incident x-rays and generate output signals representative of a radiation image.

U.S. Pat. No. 5,079,426 to Antonuk et al. discloses a direct-detection x-ray image sensor incorporating an amorphous silicon thin film transistor ("TFT") switch and photodiode array. X-rays are detected by a phosphor screen that is placed on the top of the TFT switch and photodiode array. When x-rays interact with the phosphor film, light photons are generated and converted into electronic charges by the photodiode array. The charges are read out via the TFT switches to generate an image. However, problems exist with this sensor. Because the sensor employs a phosphor screen to detect the x-rays, blurring occurs due to the fact that the light photons are emitted in all directions and are scattered inside the phosphor screen. This results in a poor image resolution. Although higher resolution can be obtained by increasing the thickness of the phosphor film, this is done at the expense of signal gain.

In an article entitled "New solid-state image pickup devices using photosensitive chalcogenide glass film," by T. Tsukada et al., published in the Proceedings of IEEE International Electron Devices Meeting, 1979, pp.134–136, a solid state image sensor is disclosed including a photoconductive selenium film deposited on a n-channel MOSFET switch array made from crystalline silicon. Although this image sensor is suitable for some imaging applications, it is not suited for large area radiation imaging applications due to the difficulties in fabricating a large sensor array on a crystalline silicon wafer.

In an article entitled "Digital radiology using self-scanned readout of amorphous selenium," authored by W. Zhao et al. presented at COMP91, Canadian Organization of Medical Physicists, Winnipeg, Manitoba, Canada, Jun. 19, 1991, a flat-panel x-ray image sensor is disclosed. The image sensor includes a thick amorphous selenium film (a-Se) on a two-dimensional TFT switch array. The TFT switches are arranged in rows and columns to form a two-dimensional imaging system. Gate lines interconnect the TFT switches in each row while source lines interconnect the TFT switches in each column. The thick selenium film is deposited directly on top of the TFT switch array and a top electrode is deposited on the selenium film. When x-rays are incident on the selenium film and the top electrode is biased with a high voltage, electron-hole pairs are separated by the electric field across the thickness of the selenium film. The holes which are driven by the electric field move toward the pixel electrodes (i.e. the drain electrodes of the TFT switches) and accumulate. This results in a charge being held by the pixel electrodes which can be used to develop an x-ray image. The charge held by the pixel electrodes can be read by supplying a pulse to each gate line. When a gate line receives a pulse, the TFT switches in the row turn on, allowing the signal charges on the pixel electrodes to flow to the source lines. Charge amplifiers connected to the source lines sense the charge and provide output voltage signals proportional to the charge and hence, proportional to the radiation exposure on the selenium film.

Because a thick amorphous selenium film is deposited on the TFT switch array, a few problems may arise which reduce image quality. During x-ray exposure, most of the holes are drawn to the pixel electrodes by the applied electric field, but some of them are drawn to the dielectric film which overlies the source and gate lines. As this occurs, the electric field above the dielectric film decreases. Because the quantum efficiency of an a-Se film is approximately approportional to the electric field in the bulk of the a-Se film, signal charges generated by x-ray exposure of the a-Se film decline. Once the electric field decreases to a certain level, x-ray generated holes become trapped in the bulk of the selenium film above the dielectric film. Also, the trapped holes in the bulk of the selenium film may be released slowly by thermal energy and collected by adjacent pixel electrodes, resulting in decay-lag which again affects image quality.

U.S. Pat. No. 5,319,206 to Lee discloses a flat panel image sensor similar to that described by Zhao except that a dielectric film is placed between the x-ray conversion layer and the pixel electrodes or between the x-ray conversion layer and the top electrode. Because no DC current component flows from the top electrode to the pixel electrode through the x-ray conversion layer due to the dielectric film, the charge stored by the pixel electrode must be read using a capacitive coupling method. Also, the reset operation (i.e. the removal of residual charges in the x-ray conversion layer) must be carried out by inverting the polarity of the biasing voltage applied to the top electrode. Although this image sensor has a high voltage tolerance due to the fact that the pixel electrodes pick up a differential voltage proportional to the radiation exposure (and not a DC component of the voltage applied to the top electrode), the image sensor suffers drawbacks. Specifically, the image sensor is difficult to operate in real time and requires a complicated driving scheme.

European Patent No. 0,588,397 discloses an x-ray imaging device designed to deal with the above described problems. The x-ray imaging device includes a doped semiconductor layer covering all of the TFT switch array with the exception of the pixel electrodes. The doped semiconductor film allows holes collected in the semiconductor film above the source and gate lines (i.e. the area between adjacent pixel electrodes) to drift towards the pixel electrodes. However, one problem exists in that since the semiconductor layer overlays the entire area of the TFT switch array between the pixel electrodes, a diffusion of charges from one pixel area to adjacent pixel areas may occur especially around bright image locations. This results in a reduction in image resolution.

In addition to the drawbacks noted above with respect to the prior art image sensors, the above described flat panel image sensors suffer from problems due to electronic noise. Because the image sensors include an M×N matrix of TFT switches, there are M×N intersections between the gate lines driving the TFT switches and the source lines upon which stored charges are to be sensed. Fluctuations in the potential on the gate lines become coupled to the source lines through parasitic capacitance at overlapping nodes of the gate and source lines and through parasitic capacitance at the TFT switches. The parasitic capacitance at the TFT switches is a result of feed-through charges generated by switching the TFT switches on and off. In both cases, this parasitic capacitance is fed to the source lines where it is passed to output circuitry in the form of electronic noise. This results in a reduction in image resolution. Accordingly, there exists a need for an improved flat panel detector for radiation imaging.

It is therefore an object of the present invention to provide a novel flat panel detector for a radiation imaging system which obviates or mitigates at least one of the above-mentioned problems.

DISCLOSURE OF THE INVENTION

According to one aspect of the present invention there is provided a flat panel detector for radiation imaging comprising:

an array of pixels arranged in rows and columns, each of said pixels including a pixel electrode to store a charge proportional to the exposure of said pixel to radiation;

a radiation transducer over said array to be exposed to incident radiation;

a plurality of source lines, each interconnecting the pixels of individuals ones of one of the rows or columns of said array;

a plurality of gate lines, each interconnecting the pixels of individual ones of the other of the rows or columns of said array, said source and gate lines crossing one another to define a plurality of overlapping nodes; and shielding means to shield said gate lines from said source lines at said overlapping nodes to reduce parasitic capacitance at the overlapping nodes.

According to another aspect of the present invention there is provided a flat panel detector for radiation imaging comprising:

a radiation transducer including a radiation conversion layer and an electrode on one side of said radiation conversion layer;

an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;

a plurality of source lines upon which charges accumulated by said pixels can be sensed, each of said source lines connecting the pixels of individual ones of one of said rows or columns;

a plurality of gate lines upon which gating signals are supplied to allow accumulated charges to be sensed, each of said gate lines connecting the pixels of individual ones of the other of said rows or columns; and shielding means to shield said gate lines from said source lines at overlapping points thereof to reduce parasitic capacitance at said overlapping points.

According to still yet another aspect of the present invention there is provided in a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, each pixel in individual ones of one of the rows or columns of the array being interconnected by a source line and each pixel in individual ones of the other of the rows or columns being interconnected by a gate line, wherein said method further comprising the step of:

shielding the gate lines from the source lines at overlapping points thereof to reduce parasitic capacitance at said overlapping points.

In one embodiment, the shielding means is in the form of a biased metal shielding plate disposed between the gate and source lines adjacent the overlapping nodes. In another embodiment, the shielding means is in the form of a shielding pad formed of semiconductor material disposed between the gate and source lines adjacent the overlapping nodes and connected to a biased metal conductor.

Preferably, the pixels are constituted by thin film transistors. In one embodiment, each of the thin film transistors includes a drain electrode constituting a pixel electrode, a source electrode constituting a portion of a source line and at least one top gate electrode disposed between the source and drain electrodes. The source, drain and at least one top gate electrodes are disposed above a channel and are laterally offset from the gate line. The at least one top gate electrode is also electrically connected to the gate line at a location spaced from the channel. In another embodiment, the at least one top gate electrode is constituted by a pair of narrow, laterally spaced top gate electrodes, both of which are electrically connected to the gate line at a location spaced from the channel.

The present invention provides advantages in that since the gate and source lines are shielded at their overlapping nodes, parasitic capacitance at the overlapping nodes is reduced. In addition, when the pixels in the flat panel detector include at least one top gate electrode that is laterally offset from the gate line, parasitic capacitance is further reduced.

BRIEF DESCRIPTION OF THE DRAWINGS

Embodiments of the present invention will now be described more fully with reference to the accompanying drawings in which.

BEST MODES FOR CARRYING OUT THE INVENTION

Figure 1:
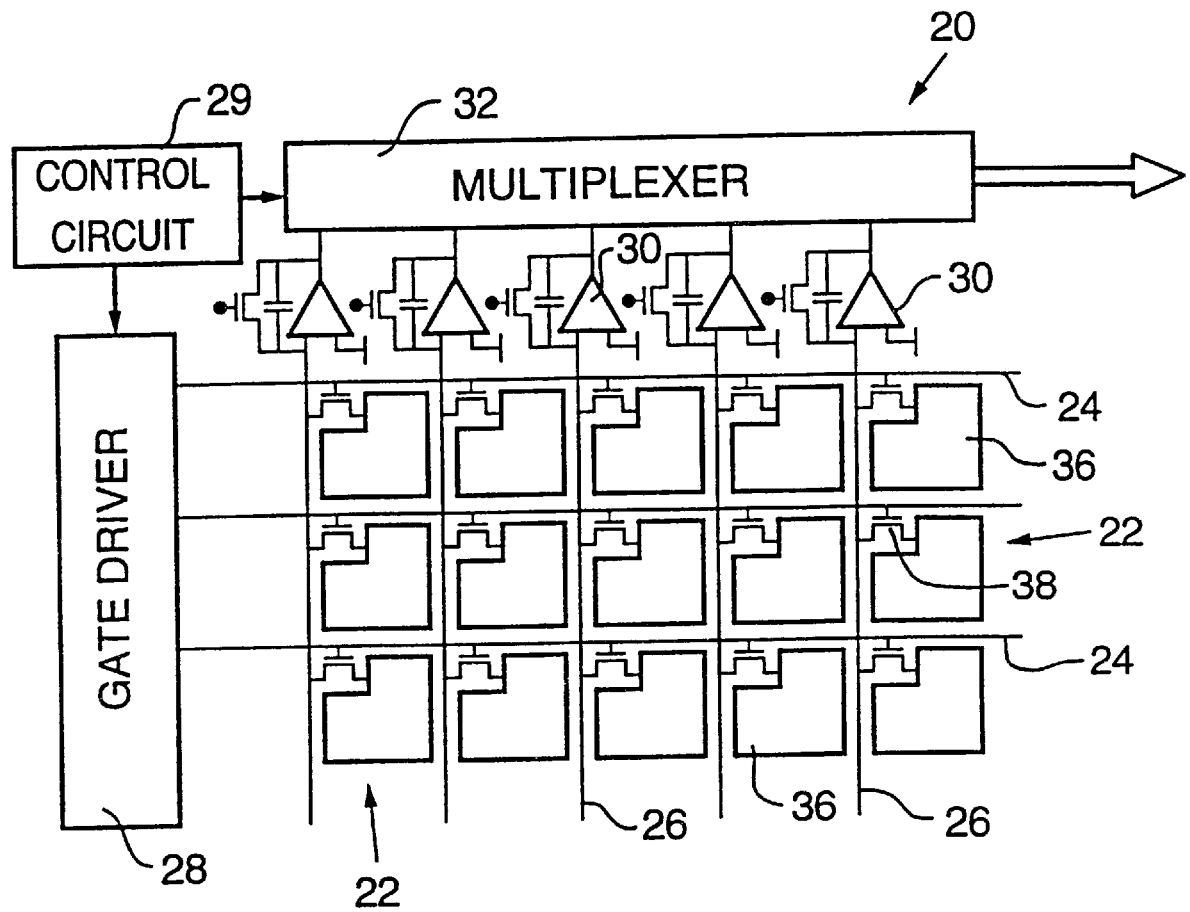
FIG. 1 is a schematic of a flat panel detector for radiation imaging in accordance with the present invention.

Referring now to FIG. 1, a flat panel detector for radiation imaging is shown and is generally indicated by reference numeral 20. The flat panel detector includes a plurality of pixels 22 arranged in rows and columns. Gate lines 24 interconnect the pixels 22 of each row while source lines 26 interconnect the pixels 22 of each column. The gate lines 24 lead to a gate driver circuit 28 which provides pulses to the gate lines in succession in response to input from a control circuit 29. The source lines 26 lead to charge amplifiers 30 which in turn are connected to an analog multiplexer 32. The analog multiplexer provides image output which can be digitized to create a digitized radiation image in response to input from the control circuit 29.

Figure 2:
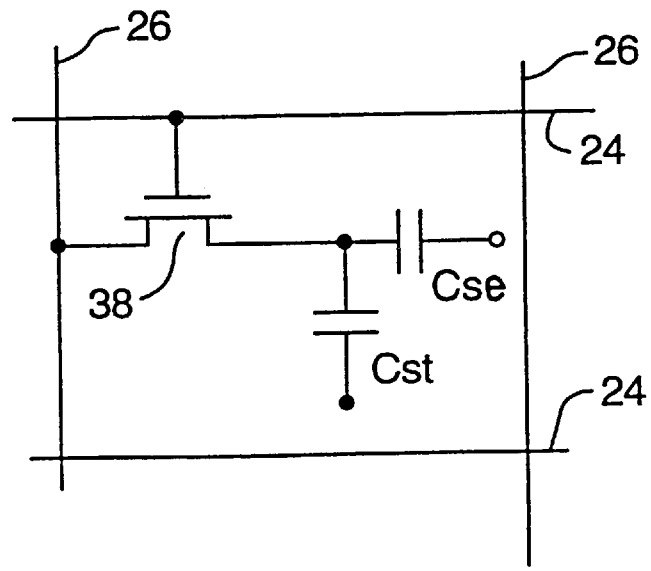
FIG. 2 is an equivalent circuit of a pixel forming part of the flat panel detector illustrated in FIG. 1.

FIG. 2 shows an equivalent circuit of one of the pixels 22. As can be seen, the pixel includes a radiation transducer $C_{SE}$ coupled to a storage capacitor $C_{ST}$ in the form of a pixel electrode 36. The pixel electrode 36 constitutes the drain electrode of a thin film transistor ("TFT") switch 38. The source electrode of TFT switch 38 is coupled to one of the source lines 26 while the gate electrode of the TFT switch 38 is coupled to one of the gate lines 24.

When the radiation transducer $C_{SE}$ is biased and is exposed to radiation, it causes the pixel electrode 36 to store a charge proportional to the exposure of the radiation transducer $C_{SE}$ to radiation. Once charged, the charge can be read by supplying a gating pulse to the gate terminal of TFT switch 38. When the TFT switch receives the gate pulse, it connects the pixel electrode 36 to the source line 26 allowing the pixel electrode to discharge. The charge on the source line 26 is detected by the charge amplifier 30 which in turn generates an output voltage proportional to the detected charge. The output voltage of the charge amplifier 30 is conveyed to the analog multiplexer 32.

The design of the flat panel detector 20 is such to obviate or mitigate at least some of the disadvantages associated with the prior art designs discussed previously by reducing parasitic capacitance in the flat panel detector and thereby reducing electronic noise.

Figure 3:
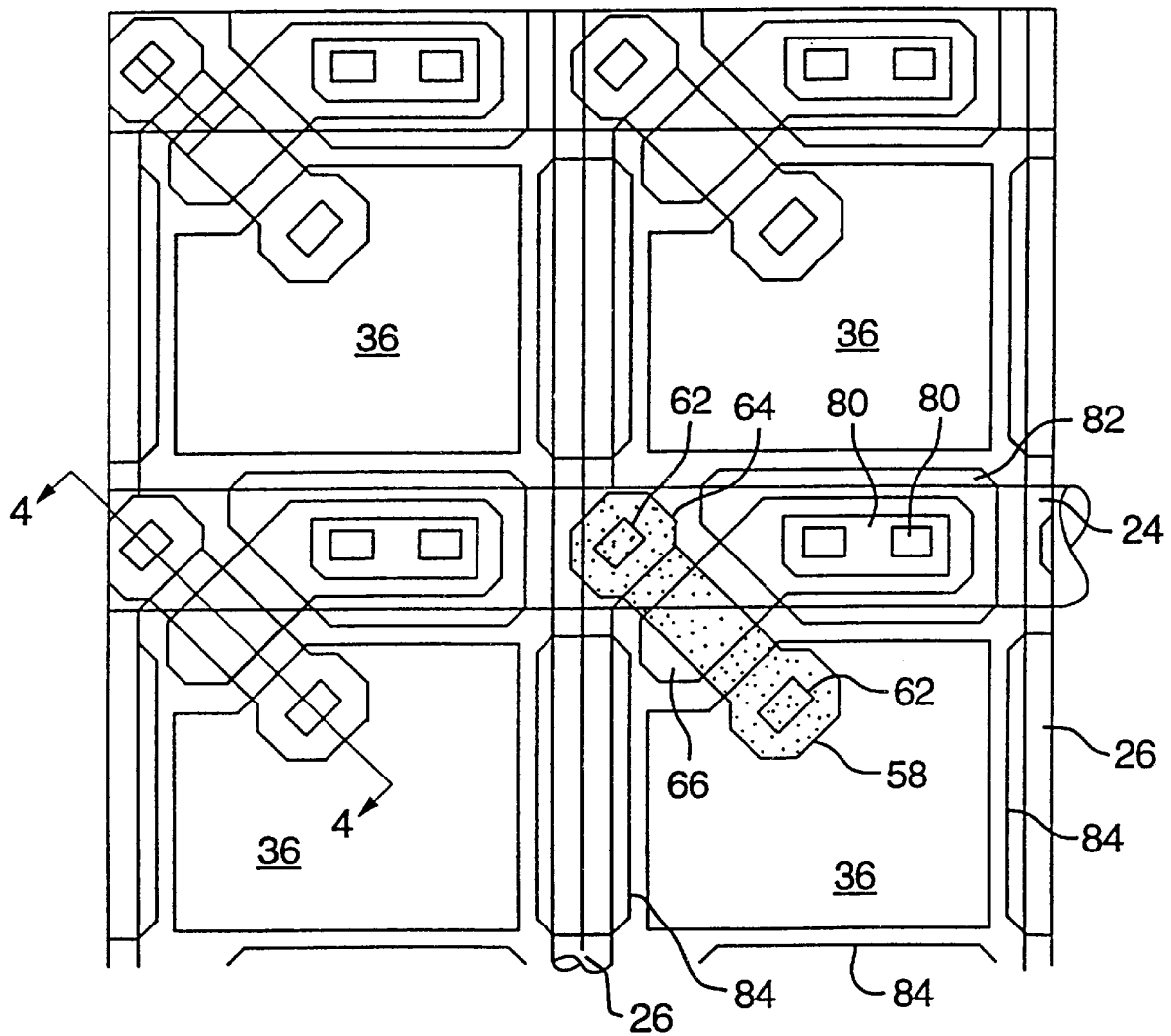
FIG. 3 is a top plan view of a portion of the flat panel detector of FIG. 1.
Figure 4:
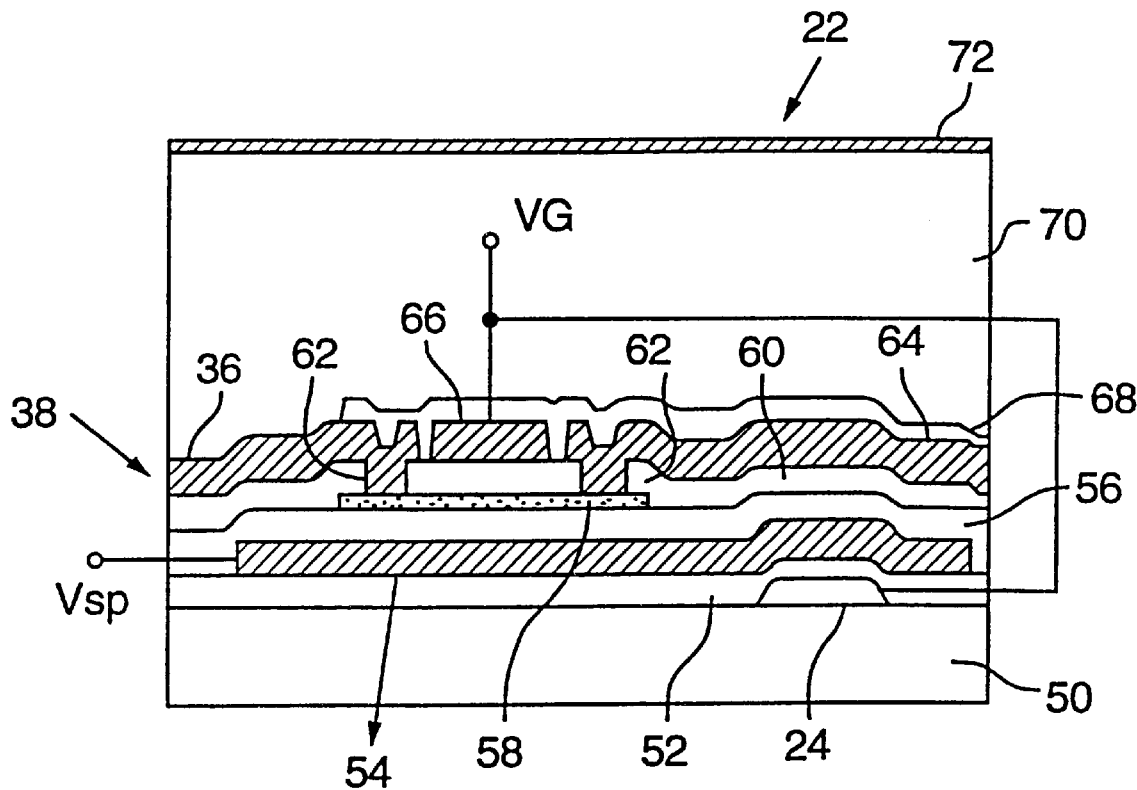
FIG. 4 is a cross-sectional view of FIG. 3 taken along line 4—4 showing a pixel.
Figure 6:
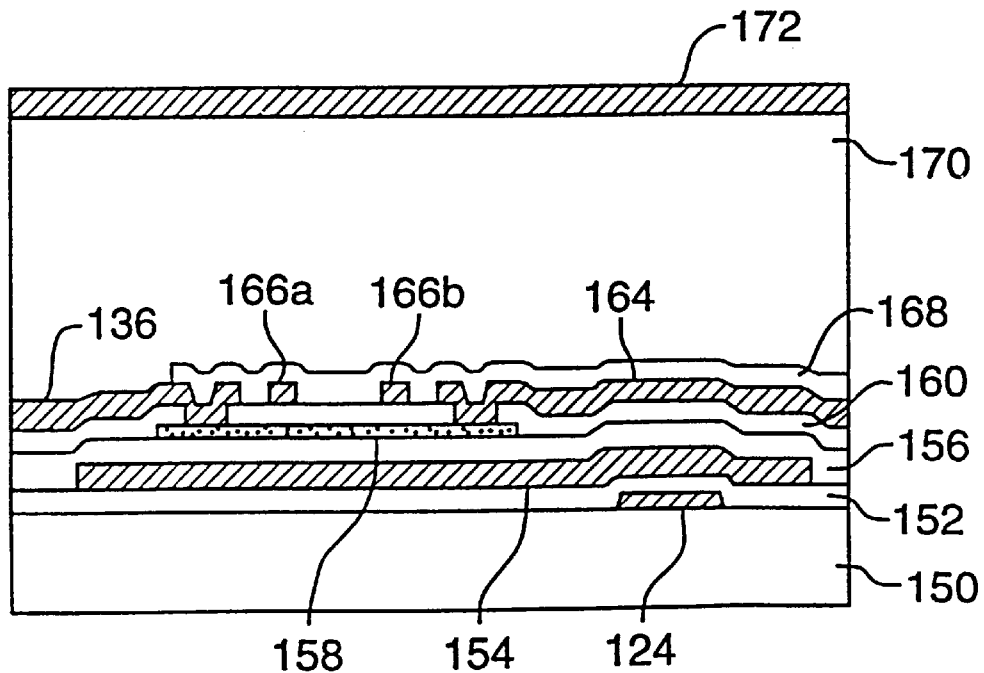
FIG. 6 is a cross-sectional view of an alternative embodiment of a pixel forming part of a flat panel detector for radiation imaging in accordance with the present invention.

Referring now to FIGS. 3 and 4, a portion of the array of pixels 22 formed in accordance with the present invention is shown. The pixels 22 including the gate and source lines 24 and 26 are fabricated on a common glass substrate 50. FIG. 4 best illustrates one of the pixels. As can be seen, the gate line 24 associated with the pixel 22 is deposited on the substrate 50. A gate insulating layer 52 formed of $SiO_2$ or $SiN_X$ overlies the substrate 50 and the gate lines 24.

Deposited on the gate insulating layer 52 above the gate line 24 is a shielding plate 54 formed of metal and coupled to a DC potential voltage source $V_{SP}$. A dielectric film 56 formed of $SiO_2$, a-SiN or $Al_2O_3$ overlies the shielding plate 54 and the portions of the gate insulating layer 52 not covered by the shielding plate. A semiconductor material layer formed of Cadmium Selenide (CdSe) defines the channel 58 of the TFT switch 38 and is deposited on the dielectric film 56. The channel 58 is disposed over the shielding plate 54 and is laterally offset from the gate line 24 by a distance of approximately 1 to 10 μm.

A passivation layer 60 in the form of an $SiO_2$ layer overlies the dielectric film 56 and the channel 58. Vias 62 are provided in the passivation layer 60 to expose portions of the channel 58. Contacting the channel 58 through one of the vias 62 and disposed over the passivation layer 60 is the pixel electrode 36 which defines the drain electrode of the TFT switch 38. A source electrode 64 also contacts the channel 58 through the other of the vias 62 and is disposed over the passivation layer 60. A top gate electrode 66 is deposited on the passivation layer 60 between the pixel and source electrodes 38 and 64 respectively. The top gate electrode 66 is spaced from the source and pixel electrodes by gaps in the order of a few microns. The top gate electrode 66 is electrically connected to the gate line 24 through vias 80 formed in the TFT array structure and through an aperture 82 formed in the shielding plate 54 (see FIG. 3). A top passivation layer 68 in the form of a photoresist overlies the TFT switch 38 except in the area over the pixel electrode 36. Although only one TFT switch 38 has been described, it should be apparent to those of skill in the art that each TFT switch 38 in the array has a similar structure and that each TFT switch 38 is formed on the substrate 50 at the same time.

The shielding plate 54 also has apertures 84 provided in it that are aligned with the gate and source lines 24 and 26 respectively. The apertures 84 are positioned at regions of the TFT switch array where the gate and source lines do not overlap.

Above the TFT switch array is the radiation transducer $C_{SE}$. The radiation transducer is in the form of a selenium (Se) radiation conversion layer 70 having a thickness of approximately 300 μm to 500 μm. Above the radiation conversion layer is a top electrode 72 formed of In, Al or Au. The top electrode 72 is coupled to a high potential voltage source 74 in the order of 3 kV to provide the necessary bias to the radiation transducer $C_{SE}$.

In operation, the top electrode 72 is biased by the high potential voltage source 74 and the flat panel detector 20 is exposed to radiation, resulting in an electric field being created in the radiation conversion layer 70 which causes electrons to move toward the top electrode 72 and holes to move towards the pixel electrodes 36. The majority of the holes migrate to the exposed pixel electrodes where positive charges are accumulated. The charges accumulated by the pixel electrodes are proportional to the exposure of the pixels 22 to radiation.

Figure 5:
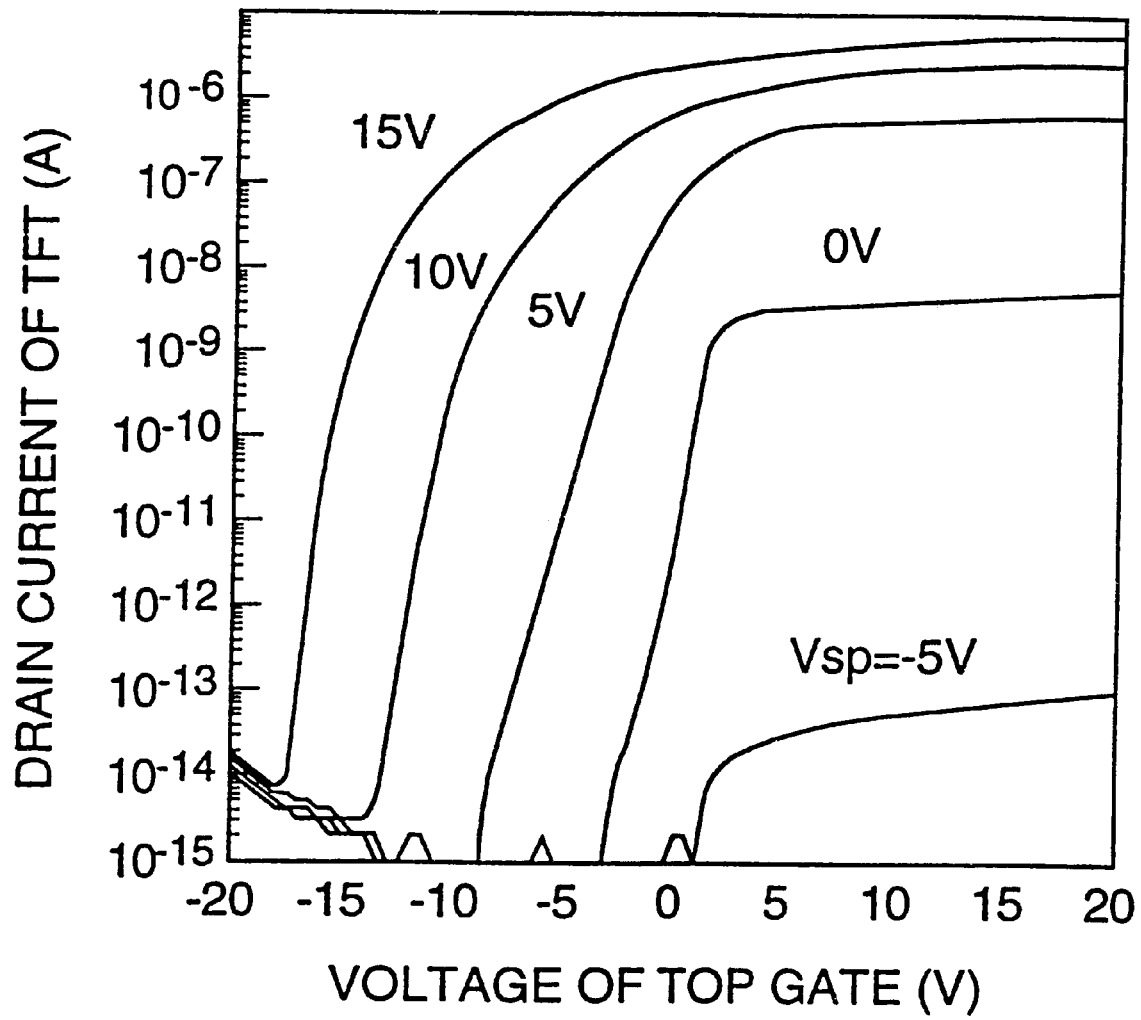
FIG. 5 is a plot of some characteristics of the pixel of FIG. 4.

After the flat panel detector 20 has been exposed to radiation and it is desired to create a radiation image, a DC voltage is applied to the shielding plate 54. The control circuit 29 is then caused to trigger the gate driver 28 to supply a switching pulse to each gate line 24 in succession. When a switching pulse is applied to a gate line 24, the switching pulse is also applied to the top gate electrode 66 of each TFT switch 38 connected to that gate line. By manipulating the DC voltage on the shielding plate 54 and the on/off voltage of the switching pulse supplied to the gate line, and hence the top gate electrode, a high on/off current ratio for the TFT switches 38 can be obtained. FIG. 5 shows the drain current verses the top gate electrode voltage characteristics of the TFT switches 38 for various DC voltages applied to the shielding plate 54.

This design of the TFT switches 38 provides advantages in that because there is no overlap between the top gate electrodes 66, which drive the channels 58, and the source and drain electrodes, parasitic capacitance in the TFT switches is reduced significantly. Also, because the source lines 26 are shielded from the gate lines 24 by the shielding plate 54, electronic noise appearing on the source lines due to potentials placed on the gate lines is reduced. This is due to the fact that because the shielding plate 54 is connected to a DC voltage source $V_{SP}$, electronic noise resulting from the switching pulses applied to the gate lines 24 is shunted to ground.

In order to reduce load capacitance on the gate lines 24, the apertures 84 are provided in the shielding plate 54. By reducing load capacitance in this manner, electronic noise in the flat panel detector 20 is further reduced.

Referring now to FIGS. 6 and 7a to 7d, an alternative embodiment of a flat panel detector for radiation imaging is shown. In this embodiment like reference numerals will be used to indicate like components with a "100" added for clarity. The pixels 122 and the flat panel detector 120 are very similar to those shown in the previous embodiment except that two spaced top gate electrodes 166a and 166b are disposed on the passivation layer 160 between the pixel and source electrodes 136 and 164 respectively. The two top gate electrodes 166a and 166b are electrically connected to the gate line 124.

The operation of the flat panel detector 120 is virtually identical to that of the previous embodiment except that the two top gate electrodes 166a and 166b reduce parasitic capacitance of the TFT switches 138 in the form of feed-through charge coming from or into the channels 158 as will now be described.

Figure 7A:
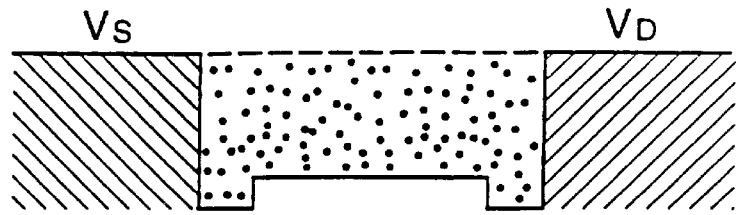
FIGS. 7a to 7d are schematic illustrations of characteristics of a prior art TFT switch and a TFT switch in accordance with the present invention.
Figure 7B:
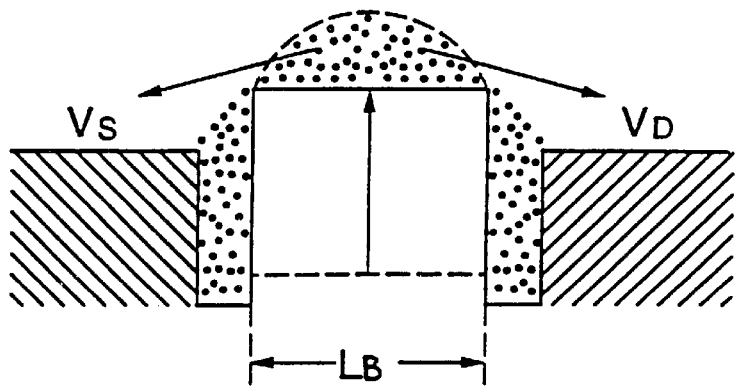

FIGS. 7a and 7b schematically demonstrate the mechanism of feed-through charge occurring when a conventional TFT switch is turned off. The feed-through charge is proportional to the area of the driving gate electrode. In principle, the feed-through charge can be reduced by using a narrow gate electrode. However, by narrowing the gate electrode, the effective length of the potential barrier $L_B$ in the off-state is not equal to the length of the channel. This results in an increase in off-state current and a decrease in the on/off current ratio of the TFT switch.

Figure 7C:
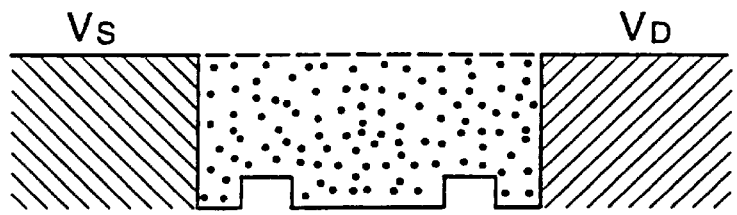
Figure 7D:
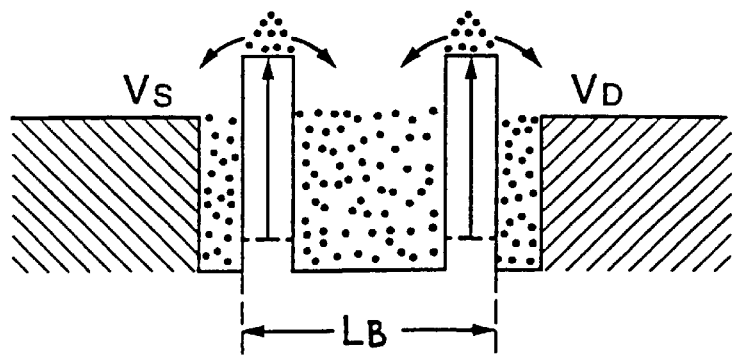

The use of the two top gate electrodes 166a and 166b deals with the above problem by reducing feed-through charge. FIGS. 7c and 7d show the mechanism of feed-through charge occurring in the TFT switch 138. As can be seen, by using the two top gate electrodes 166a and 166b, the effective length of the potential barrier $L_B$ is equal to the length between the outer sides of the two top gate electrodes (i.e. the length of the top gate electrode shown in the previous embodiment). In addition, the effective area of the driving top gate electrodes is reduced. Since the length of the potential barrier is maintained, the on/off current ratio of the TFT switch 138 remains relatively high even though feed-through charge is reduced.

Figure 8:
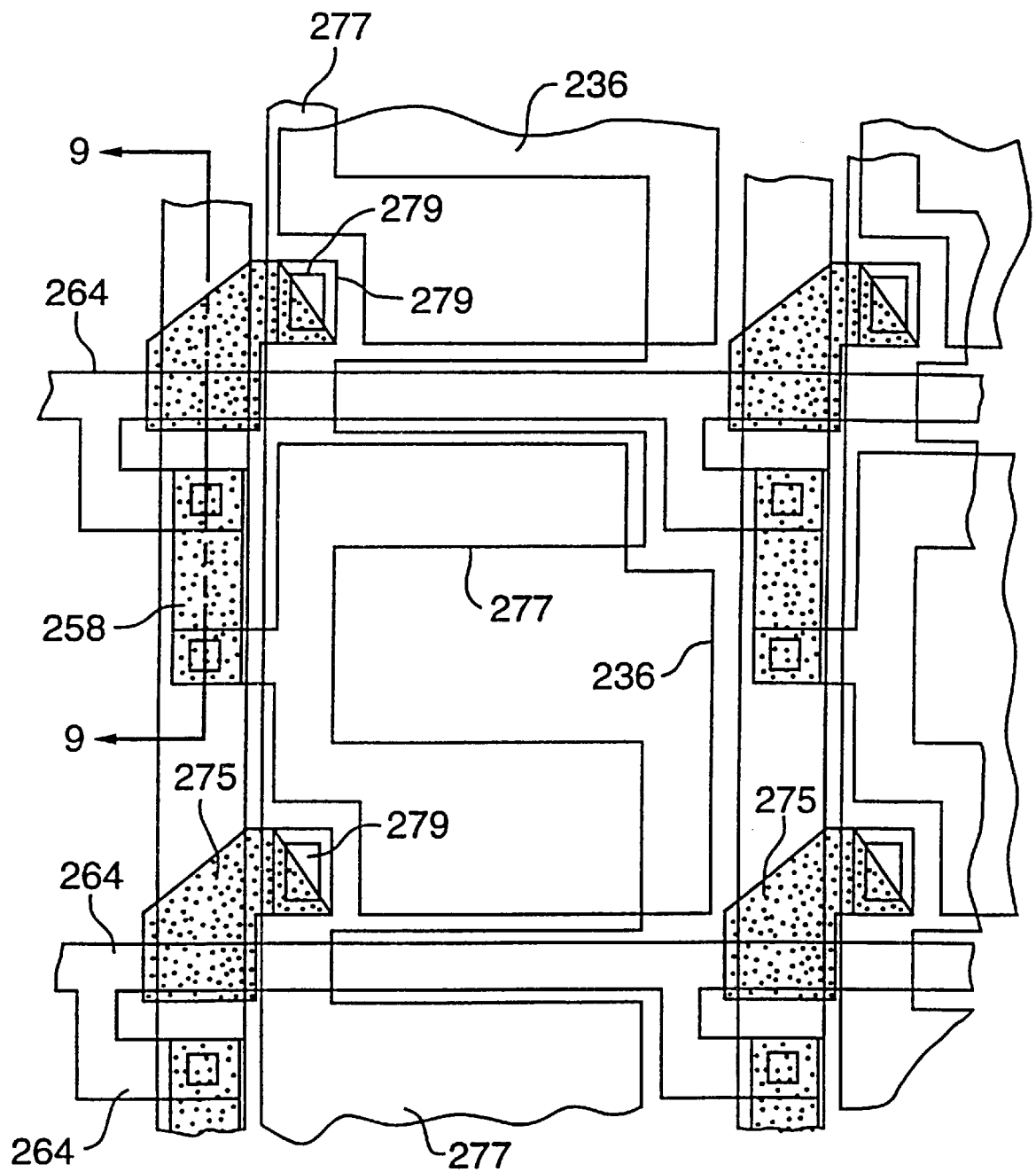
FIG. 8 is a top plan view of a portion of yet another embodiment of a flat panel detector for radiation imaging in accordance with the present invention.
Figure 9:
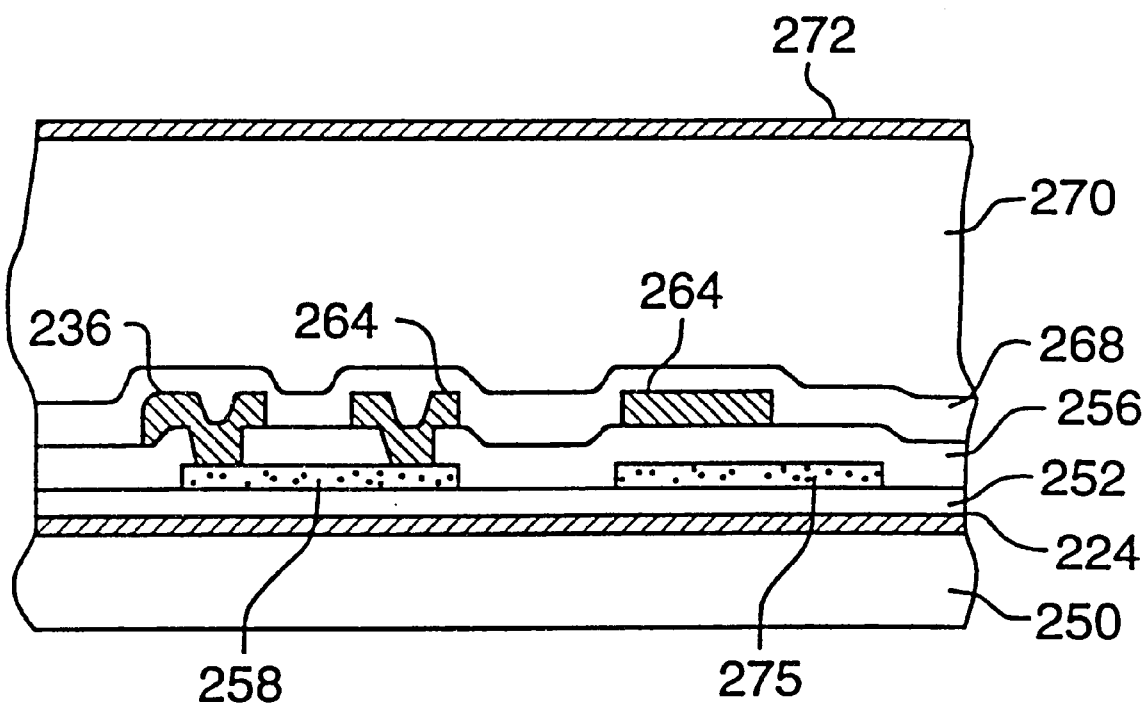
FIG. 9 is a cross-sectional view of FIG. 8 taken along line 9—9.

Referring now to FIGS. 8 and 9, yet another embodiment of a flat panel detector for radiation imaging is shown. In this embodiment, like reference numerals will be used to indicate like components with a "200" added for clarity. The flat panel detector 220 is designed to reduce parasitic capacitance at the overlapping nodes of the gate and source lines 224 and 226 respectively.

The flat panel detector 220 includes an array of pixels 222, each of which includes a TFT switch 238. FIG. 9 shows one of the TFT switches and as can be seen, unlike the previous embodiments, the TFT switch 238 does not include a top gate electrode. Instead, the gate line 224 beneath the channel 258 is not shielded by a shielding plate and therefore, is used to drive the TFT switch. However, shielding pads 275 in the form of semiconductor films are positioned between the gate insulating layer 252 and the passivation layer 260 at the overlapping nodes of the gate and source lines 224 and 226 respectively. The shielding pads are connected to a metal strip 277 through vias 279 formed in the TFT array structure. The metal strips are connected to a DC potential voltage source.

During exposure of the flat panel detector 222 to radiation, the flat panel detector operates in a conventional manner. Once exposure has been completed, and it is desired to generate a radiation image, a positive switching pulse is applied to the gate lines 224 in succession by the gate driver 28. When a switching pulse is applied to a gate line 224, the potential of the shielding pads 275 above that gate line increase. When the potentials of the shielding pads 275 exceed a threshold voltage, an electron charge pours into the shielding pads from the metal strip 277 thereby creating a charge sheet on the shielding pads 275. The charge sheet is modulated by any potential charge on the gate line 224. once a charge sheet is created, no charge from the gate line 224 can be fed through to the source line 226 above the shielding pads. By manipulating the voltage on the metal strips 277, the threshold voltage can be reduced to a small value thereby increasing the shielding between the gate and source lines at the overlapping nodes.

When the gate lines 224 are at a low potential, the shielding pads 275 act as a dielectric film. As one of skill in the art will appreciate, the use of the semiconductor film shielding pads to shield the gate and source lines at the overlapping nodes reduces parasitic capacitance at the nodes to a greater extent than does the shielding plate of the first embodiment.

Although the shielding pads 275 are shown connected to the metal strips 277 through one via 279, multiple connections at opposed ends of the shielding pads can be made to increase time response.

In addition, those of skill in the art will also appreciate that alternative structures to reduce parasitic capacitance in a flat panel detector are well within the scope of the present invention as defined by the appended claims.

What is claimed is:

1. A flat panel detector for radiation imaging comprising:
    an array of pixels arranged in rows and columns, each of said pixels including a pixel electrode to store a charge proportional to the exposure of said pixel to radiation;
    a radiation transducer over said array to be exposed to incident radiation;
    a plurality of source lines, each interconnecting the pixels in individual ones of one of the rows or columns of said array;
    a plurality of gate lines, each interconnecting the pixels in individual ones of the other of the rows or columns of said array, said source and gate lines crossing one another to define a plurality of overlapping nodes; and
    shielding means to shield said gate lines from said source lines at said overlapping nodes to reduce parasitic capacitance at the overlapping nodes.

2. A flat panel detector as defined in claim 1 wherein said shielding means is in the form of a biased metal shielding plate disposed between said gate and source lines adjacent said overlapping nodes.

3. A flat panel detector as defined in claim 1 wherein said shielding means is in the form of a shielding pad formed of semiconductor material disposed between said gate and source lines adjacent said overlapping nodes and connected to a biased metal conductor.

4. A flat panel detector as defined in claim 1 wherein said pixels are constituted by thin film transistors, each of said thin film transistors including a drain electrode constituting said pixel electrode, a source electrode constituting a portion of a source line and at least one top gate electrode disposed between said source and drain electrodes, said source, drain and at least one top gate electrodes being disposed above a channel and being laterally offset from said gate line, said at least one top gate electrode and said gate line being electrically connected at a location spaced from said channel.

5. A flat panel detector as defined in claim 4 wherein said shielding means is in the form of a biased metal shielding plate disposed between said gate and source lines adjacent said overlapping nodes.

6. A flat panel detector as defined in claim 4 wherein said shielding means is in the form of a shielding pad formed of semiconductor material disposed between said gate and source lines adjacent said overlapping nodes and connected to a biased metal conductor.

7. A flat panel detector as defined in claim 4 wherein at least one said top gate electrode is constituted by a pair of narrow, laterally spaced top gate electrodes, both of said top gate electrodes being electrically connected to said gate line.

8. A flat panel detector as defined in claim 7 wherein said shielding means is in the form of a biased metal shielding plate disposed between said gate and source lines adjacent said overlapping nodes.

9. A flat panel detector as defined in claim 7 wherein said shielding means is in the form of a shielding pad formed of semiconductor material disposed between said gate and source lines adjacent said overlapping nodes and connected to a biased metal conductor.

10. A flat panel detector for radiation imaging comprising:
  a radiation transducer including a radiation conversion layer and an electrode on one side of said radiation conversion layer;
  an array of pixels arranged in rows and columns on the other side of said radiation conversion layer, each of said pixels including a pixel electrode to accumulate charge as a result of hole drift in said radiation conversion layer occurring upon exposure of said radiation transducer to radiation and when said electrode is biased;
  a plurality of source lines upon which charges accumulated by said pixels can be sensed, each of said source lines connecting the pixels of individual ones of one of said rows or columns;
  a plurality of gate lines upon which gating signals are supplied to allow accumulated charges to be sensed, each of said gate lines connecting the pixels of individual ones of the other of said rows or columns; and
  shielding means to shield said gate lines from said source lines at overlapping points thereof to reduce parasitic capacitance at said overlapping points.

11. A flat panel detector as defined in claim 10 wherein said shielding means is in the form of a biased metal shielding plate disposed between said gate and source lines adjacent said overlapping points.

12. A flat panel detector as defined in claim 10 wherein said shielding means is in the form of a shielding plate formed of semiconductor material disposed between said gate and source lines adjacent said overlapping points and connected to a biased metal conductor.

13. A flat panel detector as defined in claim 10 wherein said pixels are constituted by thin film transistors, each of said thin film transistors including a drain electrode constituting a pixel electrode, a source electrode constituting a portion of a source line and at least one top gate electrode disposed between said source and drain electrodes, said source, drain and at least one top gate electrodes being disposed above a channel and being laterally offset from said gate line, said at least one top gate electrode and said gate line being electrically connected at a location spaced from said channel.

14. A flat panel detector as defined in claim 13 wherein said at least one top gate electrode is constituted by a pair of narrow, laterally spaced top gate electrodes, both of said top gate electrodes, being electrically connected to said gate line.

15. A flat panel detector as defined in claim 14 wherein said shielding means is in the form of a biased metal sheet disposed between said gate and source lines adjacent said overlapping points.

16. In a method of forming a flat panel detector for radiation imaging including a radiation transducer having a radiation conversion layer and an electrode on one side thereof and an array of pixels arranged in rows and columns on the other side of said radiation conversion layer, each pixel including a pixel electrode to store charge proportional to the exposure of said flat panel detector to radiation, each pixel in individual ones of one of the rows or columns of the array being interconnected by a source line and each pixel in individual ones of the other of the rows or columns being interconnected by a gate line, wherein said method further comprising the step of:
  shielding the gate lines from the source lines at overlapping points thereof to minimize parasitic capacitance at said overlapping points.

17. The method of claim 16 wherein said shielding is achieved by disposing a biased metal sheet between said gate lines and said source lines adjacent said overlapping points.

18. The method of claim 17 wherein said shielding is achieved by disposing a pad formed of semiconductor material between said gate and source lines adjacent said overlapping points and connecting said pads to a biased metal conductor.

* * * * *